(12) United States Patent
Williams et al.

(10) Patent No.: US 6,399,154 B1
(45) Date of Patent: Jun. 4, 2002

(54) LAMINATE ARTICLE

(75) Inventors: Robert K. Williams; Mariappan Paranthaman; Thomas G. Chirayil; Dominic F. Lee; Amit Goyal; Roeland Feenstra, all of Knoxville, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 4 days.

(21) Appl. No.: 09/596,988

(22) Filed: Jun. 20, 2000

Related U.S. Application Data

(60) Division of application No. 09/408,235, filed on Sep. 29, 1999, now Pat. No. 6,270,908, which is a continuation-in-part of application No. 08/922,173, filed on Sep. 2, 1997, now Pat. No. 6,077,344.

(51) Int. Cl.⁷ ................................................ B05D 3/12
(52) U.S. Cl. ..................... 427/327; 427/372.2; 427/377
(58) Field of Search ............................. 427/327, 372.2, 427/377; 428/469, 701, 702; 505/470, 191, 237

(56) References Cited

U.S. PATENT DOCUMENTS

| | | | | |
|---|---|---|---|---|
| 5,102,865 A | * | 4/1992 | Wolf et al. ..................... 505/1 |
| 5,741,377 A | | 4/1998 | Goyal et al. ................. 148/512 |
| 5,872,080 A | * | 2/1999 | Arendt et al. ................ 505/238 |
| 5,898,020 A | * | 4/1999 | Goyal et al. ................. 505/239 |
| 6,280,908 B1 | * | 8/2001 | Williams et al. ............ 428/469 |

OTHER PUBLICATIONS

S.R. Foltyn, P. Tiwari, R.C. Dye, M.Q. Lee, X.D. Wu, "Pulsed laser deposition of thick YBaCu3O7–delta films with Jc>MA/Cm2" Appl. Phys. Lett. 63 (13), Sep. 27,1993, pp. 1848–1850.*

X.D. Wu, S.R. Foltyn, P. Arendt, J. Townsend, C. Adams, I. H. Campbell, P. Tiwari, Y. Coulter, D.E. Peterson, "High current YBa2Cu3O7–delta thick films on flexible nickel substrates with textured buffer layers", Appl. Phys. lett. 65 (15) 1994, pp. 1961–1963.*

A. Goyal, et al., "High critical current density superconducting tapes by epitaxial deposition of $YBa_2Cu_3O_x$ thick films on biaxially textured metals," Appl. Phys. Lett., 69:1795 (Sep. 16, 1996).

X.D. Wu, et al., "Properties of $YBa_2Cu_3O_{7-\delta}$ thick films on flexible buffered metallic substrates," Appl. Phys. Lett. 67:2397 (Oct. 16, 1995).

J.V. Cathcart, et al., "The Structure of Thin Oxide Films Formed on Nickel Crystals," J. Electrochem. Soc. 116:664 (1969) no month.

* cited by examiner

*Primary Examiner*—Deborah Jones
*Assistant Examiner*—Stephen Stein
(74) *Attorney, Agent, or Firm*—Akerman, Senterfitt & Eidson, P.A.

(57) ABSTRACT

A laminate article comprises a substrate and a biaxially textured $(RE_xA_{(1-x)})_2O_{2-(x/2)}$ buffer layer over the substrate, wherein $0<x\leq0.70$ and RE is selected from the group consisting of La, Nd, Sm, Eu, Gd, Th, Dy, Ho, Er, Tm, Yb, and Lu. A is selected from the group consisting of $Zr^{+4}$, $Ce^{+4}$, $Sn^{+4}$, and $Hf^{+4}$. The $(RE_xA_{(1-x)})_2O_{2-(x/2)}$ buffer layer can be deposited using sol-gel or metal-organic decomposition. The laminate article can include a layer of YBCO over the $(RE_xA_{(1-x)})_2O_{2-(x/2)}$ buffer layer. A layer of $CeO_2$ between the YBCO layer and the $(RE_xA_{(1-x)})_2O_{2-(x/2)}$ buffer layer can also be include. Further included can be a layer of YSZ between the $CeO_2$ layer and the $(RE_xA_{(1-x)})_2O_{2-(x/2)}$ buffer layer. The substrate can be a biaxially textured metal, such as nickel. A method of forming the laminate article is also disclosed.

12 Claims, 12 Drawing Sheets

LAMINATE ARTICLE

This application is a divisional application of U.S. patent application Ser. No. 09/408,235, filed Sep. 29, 1999, now U.S. Pat. No. 6,270,908; and a Continuation-in-Part of U.S. patent application Ser. No. 08/922,173, filed Sep. 2, 1997, now U.S. Pat. No. 6,077,344.

STATEMENT REGARDING FEDERALLY SPONSORED RESEARCH AND DEVELOPMENT

This invention was made with government support under contract DE-AC05-96OR22464, awarded by the United States Department of Energy to Lockheed Martin Energy Research Corporation, and the United States Government has certain rights in this invention.

FIELD OF THE INVENTION

This invention relates to biaxially textured metal oxide buffer layer on metal substrates. More specifically, the invention relates to a non-vacuum process for depositing films of rare-earth oxides with single orientations on metal substrates.

BACKGROUND OF THE INVENTION

Biaxially textured metal oxide buffer layers on metal substrates are potentially useful in electronic devices where an electronically active layer is deposited on the buffer layer. The electronically active layer may be a superconductor, a semiconductor, or a ferroelectric material.

For example, the next generation of superconducting wire to be used for power transmission lines will have a multilayer composition. Such deposited conductor systems consist of a metal substrate, buffer layer, and a superconducting layer. The metal substrate, such as Ni, Ag, or Ni alloys, provides flexibility and support for the wire. Metal oxide buffer layers, such as cerium oxide ($CeO_2$), or yttria-stabilized zirconia (YSZ), comprise the next layer and serve as chemical barriers between the metal substrate and the top layer, the high-temperature superconductor.

For a superconducting film to carry a high current, a certain degree of alignment between grains of the superconductor is required. Most preferably, the grains should be aligned both perpendicular to the plane of the substrate (c-axis oriented) and parallel to the plane of the substrate (a-b alignment). To achieve this alignment, high $T_C$ superconductors have generally been deposited on (100) oriented single-crystal oxide substrates. However, single-crystal substrates are generally too expensive and have poor mechanical properties. As such, single-crystal substrates are presently unsuitable as practical conductors.

A method to develop practical coated conductors is disclosed in U.S. Pat. No. 5,741,377 ('377) by Goyal et al. This method called RABiTs, short for rolling assisted biaxially textured substrates, uses roll-texturing of metal to form a metallic tape with a {100}<001>cubic structure. However, if the metal is nickel or a nickel alloy, a buffer layer between the metal substrate and the ceramic superconductor is necessary to prevent interdiffusion of the ceramic superconductor and the metal substrate and also to prevent the oxidation of nickel substrate during the deposition of the superconducting layer. Useful buffer layers include cerium oxide, yttrium stabilized zirconia (YSZ), strontium titanium oxide, rare-earth aluminates and various rare-earth oxides.

Conductors based on the RABiTs approach typically consist of a biaxially textured metal substrate, one or more buffer layers (usually oxides), and the superconducting compound YBCO or one of the Bi, Tl, or Hg superconductors. To achieve high critical current densities, it is important that the biaxial orientation be transferred from the substrate to the superconducting material. As stated, a biaxially textured metal substrate can be provided by the method disclosed in the '377 patent.

The purpose of the buffer layers is to transmit the biaxial texture of the metallic substrate to the superconductor and to prevent NiO formation and chemical interactions between the metal substrate and $YBa_2Cu_3O_{7-\delta}$(YBCO). The conventional processes that are currently being used to grow buffer layers on metal substrates and achieve this transfer of texture are vacuum processes such as pulsed laser deposition, sputtering, and electron beam evaporation. Researchers have recently used such techniques to grow biaxially textured YBCO films on metal substrate/buffer layer samples that have yielded critical current densities ($J_C$) between 700,000 and $10^6$ A/cm$^2$ at 77 K (A. Goyal, et al., "Materials Research Society Spring Meeting, San Francisco, Calif., 1996; X. D. Wu, et al., *Appl. Phys. Lett.* 67:2397, 1995). One drawback of such vacuum processes is the difficulty of coating long or irregularly shaped substrates, and the long deposition times and relatively high temperatures required.

Another purpose of the buffer layers is to prevent oxidation of the metal substrate (for example NiO, when using Ni). If the Ni begins to oxidize, the resulting NiO will likely to grow in the (111) orientation regardless of the orientation of the Ni (J. V. Cathcart, et al., *J. Electrochem. Soc.* 116:664, 1969). This (111) NiO orientation adversely affects the growth of biaxially textured layers and will be transferred, despite the substrate's original orientation, to the following layers.

A typical architecture is $Ni/CeO_2/YSZ/CeO_2/YBCO$. The $CeO_2$ layers are kept thin to avoid cracking and the thicker YSZ layer provides chemical protection. The top layer of $CeO_2$ is included because the lattice parameter of YSZ does not match that of YBCO very well. The difference is about 5%.

For producing high current YBCO conductors on {100}<001>textured Ni substrates, high quality buffer layers are necessary. Buffer layers such as $CeO_2$ and YSZ have previously been deposited using pulsed laser ablation, e-beam evaporation, and sputtering. In addition, solution techniques have been used to deposit films of rare-earth aluminates on biaxially textured nickel substrates. However, the rare-earth aluminates had c-axis alignment but have frequently given a mixture of two epitaxies (100)[001] and (100)[011]. This is a structure believed to be unsuitable for growth of high critical current films.

It has been demonstrated that $RE_2O_3$ (rare earth oxides) can be grown epitaxially on is textured Ni substrates by both reactive evaporation and sol-gel processing techniques. However, the process window for growing $RE_2O_3$ films are very narrow. Additionally, some of the rare earth oxides go through a cube to monoclinic phase transition.

SUMMARY OF THE INVENTION

It is an object of the invention to provide a new and improved method for fabricating alloy and laminated structures having epitaxial texture.

It is another object of the invention to provide a method to produce epitaxial superconductors on metal alloys and laminated structures having epitaxial texture.

It is yet another object of the invention to provide a non-vacuum process to produce epitaxial buffer layers on metal substrates.

It is a further object of the invention to provide a process for growing rare-earth zirconium oxide buffer layers with single in-plane epitaxy.

Another object of the invention is to provide an epitaxial textured laminate using rare-earth zirconium oxides.

Still another object of the invention is to provide an epitaxial textured superconducting structure having a $J_C$ of greater than 100,000 A/cm$^2$ at 77 K and self-field.

Yet another object of the invention is to provide a solution process for producing single cube oriented oxide buffer layers.

Still a further object of the invention is to reduce the number of buffer layers in a laminated superconductor structure while retaining a good epitaxial match to YBCO.

These and other objects of the invention are achieved by the subject method and product.

BRIEF DESCRIPTION OF THE DRAWINGS

There are shown in the drawings embodiments of the invention that are presently preferred, it being understood, however, that the invention is not limited to the precise arrangements and instrumentalities shown, wherein.

DETAILED DESCRIPTION OF THE INVENTION

Figure 1:
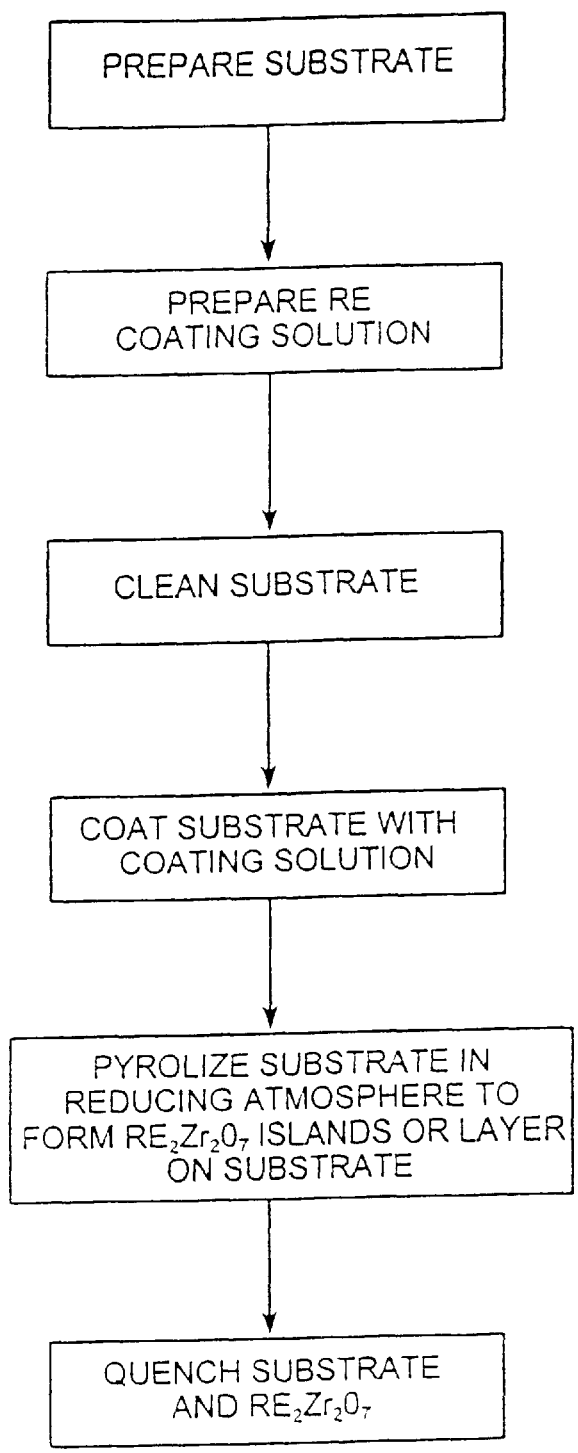
FIG. 1 is a flow diagram illustrating method steps according to a first embodiment of the invention.

Referring to FIG. 1, a method for depositing single epitaxial films of rare-earth zirconium oxides on metal substrates, according to the present invention, is illustrated, The method comprises preparing a biaxially textured metal substrate, preparing a rare-earth zirconium oxide coating solution, coating the metal substrate with the coating solution, and heat treating the metal substrate and solution to pyrolize the coating solution and to form a rare-earth zirconium oxide on the substrate.

PREPARE SUBSTRATE

Any method of preparing a biaxially textured metal substrate is acceptable for use with this invention. However, the presently preferred method of preparing the biaxially textured metal substrate is disclosed in U.S. Pat. No. 5,741,377 by Goyal et al., which is incorporated herein by reference. The biaxial texture is achieved, for example, by cold rolling high purity (99.99%) nickel rod in a rolling mill until the length of the rod had been increased by a factor of about 20 (deformation was over 95%). The desired cube texture {100}<001> was developed by recrystallization of the rolled Ni at 800° C. for 60–120 minutes at a pressure less than 10$^{-7}$ torr or at 900° C. for 60 minutes in a 4% $H_2$/Argon gas mixture. Although pre-annealing of the metal substrate to obtain the desired cube structure prior to deposition of additional layer is presently preferred, this is not required. Other preferred materials include, but are not limited to copper, iron, aluminum, and alloys containing any of the foregoing, including nickel.

CLEAN SUBSTRATE

Prior to coating the metal substrate with the rare-earth zirconium oxide coating solution, the metal substrate is preferably cleaned to remove any organics on the metal substrate. Any method of removing organics from the metal substrate is acceptable for use with this invention. For example, the organics can be removed by methods such as vacuum annealing, electro-polishing, or reverse sputtering. However, the presently preferred method of removing organics from the metal substrate is to ultrasonically clean the metal substrate in a cleaning solution.

Any cleaning solution capable of being used during ultrasonification is acceptable for use with this invention; however, the presently preferred cleaning solution is isopropanol. The invention is not limited as to a particular length of time in which the metal substrate is ultrasonically cleaned so long as the organics are removed from the metal substrate. A preferred range of time is between about 5–60 minutes, and a most preferred length of time is about 60 minutes.

PREPARE SOLUTION

Many different methods of preparing a coating solution for use with the invention are known. Three commonly used solution preparation techniques are as follows: (i) sol-gel processes that use metal alkoxide complexes in alcohol solution; (ii) hybrid processes that use chelating agents such as acetylacetonate or diethanolamine to reduce alkoxide reactivity; and (iii) metal-organic decomposition (MOD) techniques that use high-molecular-weight precursors and water-insensitive carboxylates, 2-ethyl-hexanoates, naphthanates, etc. in an organic solvent. Although the coating solution can be prepared using any of these methods, any method capable of producing a coating solution capable of being coated on a metal substrate and subsequently capable of forming a rare-earth zirconium oxide on the substrate is acceptable for use with this invention. Additionally, the coating solution can be prepared using any combination of the three methods discussed above or with any other method that requires solution precursors.

In the presently preferred embodiment of invention, rare-earth and zirconium alkoxide precursors were used in 2-methoxyethanol. The preferred alkoxide being rare-earth methoxyethoxides and zirconium n-propoxide. An illustrative example of the method is as follows. The rare-earth isopropoxides and zirconium n-propoxide are reacted with 2-methoxyethanol under an inert atmosphere. After refluxing, a portion of the solution is removed by distillation. The remaining solution is then cooled and additional 2-methoxyethanol is added. The solution was again refluxed, and further portion of the solution was removed by distillation. The process of dilution, reflux, and distillation is repeated to ensure the complete exchange of the methoxyethoxide ligand for the isopropoxide ligand.

The final concentration of the solution is adjusted to obtain a 0.25 M solution of $RE_2Zr_2O_7$ precursor solution in 2-methoxyethanol. The final coating solutions is prepared by reacting 1 part of a 1.0 molar solution of water in 2-methoxyethanol with cation equivalent of the $RE_2Zr_2O_7$ precursor solution. Hydrolysis was not necessary in some instances.

APPLYING THE COATING SOLUTION TO THE METAL SUBSTRATE

Any method of applying the coating solution to the metal substrate is acceptable for use with this invention. However, two preferred methods of applying the coating solution to the metal substrate are (i) spin coating and (ii) dip coating. For either of the two preferred methods, the metal substrate can be dipped in a controlled atmosphere or in air.

Spin coating involves spinning the metal substrate at high revolutions per minute (RPM), for example approximately 2,000 RPM, applying the solution onto the metal substrate.

Equipment capable of spin coating is known in the art as a spinner. For example spinners are used during semiconductor manufacturing to apply photo-resist to semiconductor wafers. However, the invention is not limited as to a particular type of spinner. Any spinner capable of applying a coating solution to the metal substrate is acceptable for use with this invention. Additionally, so long as coating solution is applied to the metal substrate with the desired thickness and uniformity, the invention is not limited as to any particular process parameters for use with the spinner. In a preferred embodiment of the invention, however, the spinner is operated at about 2000 RPM for a period of about 30 seconds to obtain a continuous coating.

Figure 12:
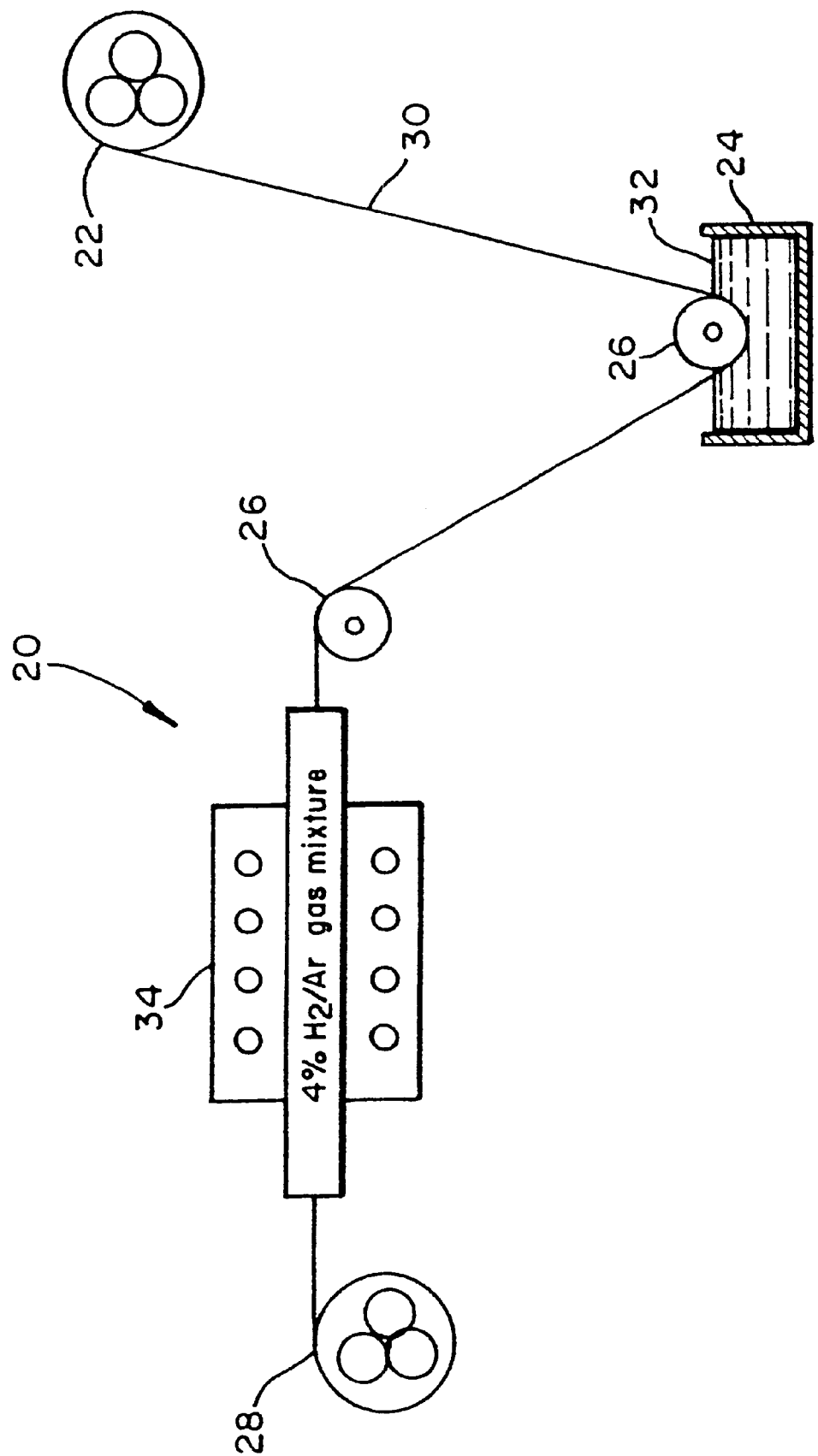
FIG. 12 is a schematic of a reel-to-reel continuous dip-coating unit.

Although any equipment can be used to dip coat the coating solution onto the metal substrate, the preferred equipment is a reel-to-reel dip-coating unit as illustrated in FIG. 12. The reel-to-reel dip-coating unit 20 includes a pay-out reel 22, a solution container 24, pulleys 26, and a take-up reel 28. The pay-out reel 22 provides the metal substrate 30 for dipping. The solution container 24 contains the coating solution 32, and the pulleys 26 direct the metal substrate 30 into the coating solution 32 and onto the take-up reel 28.

Also included can be a furnace 34 for heat treatment of the metal substrate 30 and coating solution 32. The furnace 34 is preferably disposed between the solution container 24 and the take-up reel 28. The take-up reel 28 acts to retrieve the metal substrate 30 after being coated with the coating solution 32.

The rate at which the metal substrate 30 is withdrawn from the coating solution 32 depends upon the desired thickness and concentration of the coating solution 32 on the metal substrate 30. As the rate of withdrawal increases, at a given point, depending on the solution and the substrate, the amount of coating solution 32 applied to the metal substrate 30 increases. However, so long as the coating solution 32 is applied to the metal substrate 30 with the desired thickness and consistency, the invention is not limited as to any particular withdrawal rate. In a preferred embodiment of the invention, however, the metal substrate is withdrawn at a rate of about 1–3 m/hour.

HEAT TREATING

The heat treatment process pyrolyzes the coating solution thereby leaving the rare-earth zirconium oxide remaining on the metal substrate. The enclosure containing the metal substrate is preferably purged with a reducing atmosphere prior to the beginning of the heat treating process. Purging the container prior to heat treatment removes undesirable contaminants from the atmosphere within the enclosure. During the heat treating process, the metal substrate is preferably maintained in a reducing atmosphere to prevent any oxidation of the metal substrate. An inert atmosphere may also be preferably maintained around the metal substrate during is cooling. Also, by maintaining the reducing atmosphere around the metal substrate during cooling, oxidation of the metal substrate can be prevented.

The heat treatment process is for a combination of time and temperature sufficient to pyrolyze the coating solution and leaves the desired crystal structure of the rare earth zirconium oxide. Any time and temperature combination sufficient to pyrolyze the coating solution and leave the desired crystal structure of the rare earth zirconium oxide is acceptable for use with the invention. A more detailed discussion as to the preferred temperature ranges for the various rare earth zirconium oxide compounds is included below.

During the heat treatment process, low partial pressures of water and/or oxygen gas can be introduced into the atmosphere surrounding the metal substrate. The addition of water and/or oxygen gas acts as a catalyst for pyrolizing the coating solution at lower temperatures. Thus, the introduction of low partial pressures of water or oxygen gas into the atmosphere advantageously allows for a lower processing temperature.

Hydrogen containing atmospheres are the preferred atmospheres for the heat treatment of the coated substrates, with 4 vol. % hydrogen in argon, helium, or nitrogen the most preferred atmosphere for safety reasons. Mixtures of 2–6 vol. % hydrogen are commonly referred to as "forming gas" and are not generally combustible under most conditions. Carbon monoxide/carbon dioxide mixtures are also commonly used as gaseous reducing agents.

Any furnace capable of producing the desired temperature and time parameters is acceptable for use with this invention. Additionally, any enclosure for the metal substrate capable of preventing contamination of the metal substrate is acceptable for use with this invention. However, the presently preferred enclosure is equipped with gas fixtures for receiving the reducing atmosphere.

An illustrative example of the preferred heat treatment process follows, it is being understood that the practice of the invention is not limited in this manner. The coated metal substrate is placed in a quartz tube equipped with a gas inlet and outlet. A bottled gas mixture containing 4% hydrogen in 96% argon is then allowed to flow into the quartz tube for 20–30 minutes at room temperature. At the same time, the furnace is preheated to the desired temperature. The quartz tube is then introduced into the furnace and heated for a period of approximately one hour. After heating, the metal substrate is quenched to room temperature by removing the quartz tube from the furnace. During quenching the flow of 4% hydrogen in 96% argon gas mixture is maintained.

STRUCTURE

The invention provides a buffer layer having a good lattice match with the high-temperature superconducting (HTS) layer. This is preferably accomplished by providing a $RE_2Zr_2O_7$ buffer layer grown using the preferred solution process discussed above. In $RE_2Zr_2O_7$, with RE=La to Lu, many of these compounds have a cubic pyrochlore structure. This structure may be stable up to the melting point of the composition and therefore a large process window is available. Thus, by using $RE_2Zr_2O_7$, the lattice parameters can be tailored to match the metal substrate or the HTS layer. RE is defined as one or more rare earth elements, alone or in combination.

Having a good lattice match provides for improved epitaxy of the superconducting layer. For example, the lattice parameter, $a_o$, of the superconducting material YBCO is 3.821 Å, and the lattice parameter of the YSZ buffer layer common used with YBCO is about 3.64 Å. YSZ also has a cubic fluorite structure. However, the cubic fluorite structure and the related cubic pyrochlore phases can also be obtained by adding La and other rare earth elements to $ZrO_2$. The pyrochlore phases are an ordered fluorite lattice with a lattice parameter twice that of the fluorite phase. This ordering occurs for the La and the lower mass rare earths and is related to the well-known lanthanide contraction. The lattice parameters of these phases are larger than lattice parameters for YSZ, and this leads to a better lattice match with the YBCO and improved epitaxy of the YBCO.

It is observed that the size of the trivalent rare earth ions decreases as the atomic number increases. This effect reduces the lattice parameters of the rare earth stabilized zirconias. All of the pyrochlore and fluorite phases exist over a range of compositions, but the ranges are more restricted for La and the lower mass rare earths. The lattice parameters of these phases all increase with rare earth content. Importantly, the best matches with YBCO occur when the phases are saturated with La or the rare earth elements. Experimental values for the composition dependence of $a_o$ for these phases are summarized in Table I.

TABLE I

Effect of Composition on the Lattice Parameters ($a_0$)
of Cubic Lanthanum and Rare Earth Fluorites and Pyrochlores[1]

| Element | $\Delta a_0/\Delta x$[2] |
|---|---|
| La | 0.19 |
| Nd | 0.43 |
| Sm | 0.39 |
| Eu | 0.23 |
| Gd | 0.33 |
| Tb | u |
| Dy | 0.23 |
| Ho | 0.17 |
| Er | 0.17 |
| Tm | u |
| Yb | 0.13 |

[1]Composition is defined by "x" in $RE_xZR_{1-x}O_2 - x/2$.
[2]Assumes both fluorites and pyrochlores have the fluorite structure.
u = unavailable Table II illustrates the lattice mismatch between rare earth fluorites and pyrochlores and YBCO. The second column indicates the preferred maximum solubility of moles ("x") of the rare earth in the equation $RE_xZr_{1-x}O_2-x/2$. If x exceeds the number indicated in the second column, the resulting structure may not be stable and therefore can decompose to form a mixture of phases. The maximum values of x were obtained from phase diagrams readily available in the literature. For each rare earth element, $ZrO_2$ to $RE_2O_3$ (0 to 100 mol. %) will be plotted against temperature. At each temperature, the existence of a given phase will be apparent for a given value of x. These diagrams also indicate that the values of x are nearly independent of temperature. The processing ranges for the rare earths are about 600–1455° C.

The third column is an indication of the change in $a_o$ versus the change in x. The fourth column indicates the lattice parameter, $a_o$, when x=0.5. This provides a structure of $RE_{0.5}ZrO_{0.5}O_{1.75}$, which is equivalent to $RE_2Zr_2O_7$.

The fifth column indicates the best percentage match of the rare earth fluorite/pyrochlore lattice parameter with the lattice parameter of YBCO using the value of x indicated in column 2. As illustrated, all of the rare earth stabilized zirconias provide a better lattice match with YBCO than does YSZ. Additionally, the cubic pyrochlore $La_{0.57}Zr_{0.43}O_{1.715}$ is presently the most preferred structure.

TABLE II

Lattice Mismatch Between Rare Earth Fluorites/Pyrochlores and 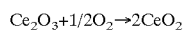

| Element | Maximum "x" for Cubic $Ln_xZr_{1-x}O_2$-x/2 | $\Delta a_o/\Delta x$ | Fluorite $a_o$[1] for x = .5 | $a_o$ (max)/$a_o$ (YBCO) |
|---|---|---|---|---|
| La | 0.57 | 0.19 | 5.403 | 0.992 |
| Nd | 0.60 | 0.43 | 5.339 | 0.986 |
| Sm | 0.70 | 0.39 | 5.275 | 0.981 |
| Eu | u | 0.23 | 5.277 | u |
| Gd | 0.70 | 0.33 | 5.264 | 0.976 |
| Tb | u | u | u | u |
| Dy | 0.67 | 0.23 | 5.21 | 0.962 |
| Ho | 0.56 | 0.17 | 5.20 | 0.954 |
| Er | 0.50 | 0.17 | 5.19 | 0.951 |
| Tm | u | u | u | u |
| Yb | 0.67 | 0.13 | 5.17 | 0.951 |
| Lu | u | u | u | u |
| Y | (commercial stabilized zirconia for comparison) | | | 0.941 |

[1]Pyrochlore phases are treated as fluorites with $a_o$ = a/2 (fluorite)
u = unavailable
x was determined using phase diagrams from "Phase Diagrams for Ceramists", Vols 1–4, The American Ceramic Society, Columbus Ohio (1964–1981).

It is noted that two of the rare earths, Ce and Pr, were omitted from Table II because they exhibit both +3 and +4 valence states. Thermodynamic calculations show that at 1000 K the reaction:

$$Ce_2O_3+1/2O_2 \rightarrow 2CeO_2$$

occurs if $PO_2$ exceeds about $10^{-6}$ atmosphere. Data is not available to evaluate the actual decomposition, illustrated by:

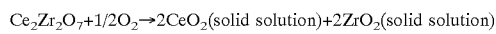

but its equilibrium pressure at 1000 K must be greater than $10^{-6}$ atm.

The calculations show that the Pr pyrochlore should be much more stable. At 1000 K the pyrochlore $Pr_2Zr_2O_7$ phase would be expected to be stable at oxygen pressures below about 0.26 atm. Development of buffer layer compound materials based on Pr would be hindered by a lack of phase diagram information.

Partial substitution of $Ce^{+4}$ for $Zr^{+4}$ in the pyrochlore (ordered fluorite) phase increases the lattice parameter and therefore could also improve epitaxy. It has been shown that replacing 20% of the $Zr^{+4}$ in $Nd_2Zr_2O_7$ with $Ce^{+4}$ increases $a_0$ by 0.5%. Thus, substituting $Ce^{+4}$ pyrochlore phase can therefore produce a nearly perfect lattice match to the YBCO lattice. However, the previously discussed thermodynamic calculations indicate that $Pr^{+4}$—$Zr^{+4}$ substitutions probably would not take place because the $Pr^{+4}$ would likely reduce to $Pr^{+3}$.

Furthermore, two more types of rare earth pyrochlores have $a$, values favorable for YBCO epitaxy. These compounds are based on $SnO_2$ and $HfO_2$; however, phase diagram information is not available. Also, the $SnO_2$ compounds should be less stable than those containing $ZrO_2$ and $HfO_2$.

In addition to providing favorable epitaxial conditions by having a closer match of lattice parameters with the superconducting material, the rare earth zirconates advantageously offer favorable chemical characteristics. When a YSZ buffer layer is used with YBCO, after a given time at the processing temperature, a $BaZrO_3$ reaction layer begins to form at the interface between the YSZ buffer layer and YBCO because the Ba of $YBa_2Cu_3O_7$ reacts with the Zr of YSZ. However, at least two reasons indicate that growth of the $BaZrO_3$ reaction layer will be less of a problem with a rare earth stabilized zirconia (RESZ) buffer layer. One reason is that the layer will contain less $ZrO_2$ by roughly a factor of two. Additionally, pyrochlore compositions are essentially interoxide compounds and therefore have greater thermodynamic stability. Therefore, a YBCO film can be grown directly on $RE_2Zr_2O_7$ without the need for a $CeO_2$ cap layer although it is possible to still use a $CeO_2$ cap layer.

EXAMPLE 1

Lanthanum isopropoxide was synthesized using the method of Brown et al. The $La_2Zr_2O_7$ precursor solution was prepared by mixing 0.988 g (3.125 mmole) of lanthanum isopropoxide and 1.462 g (3.125 mmole) of zirconium n-propoxide and reacting the mixture with 50 ml of 2-methoxyethanol under an inert atmosphere. After refluxing for approximately 1 hour, approximately 30 ml of the solvent mixture (isopropanol, n-propanol, and 2-methoxyethanol) was removed by distillation. The flask was allowed to cool, and 50 ml of 2-methoxyethanol was added. This process of reflux, and distillation was repeated to ensure the complete exchange of the methoxyethoxide ligand for the isopropoxide ligand. The final concentration of the solution was adjusted by adding 25 ml of 2-methoxyethanol to obtain a 0.2 M $La_2Zr_2O_7$ precursor solution in 2-methoxyethanol. A partially hydrolyzed solution suitable for spin coating or dip coating was prepared by reacting 1 part of a 1.0 molar solution of water in 2-methoxyethanol per cation equivalent of the $RE_2Zr_2O_7$ precursor solution.

Strips of roll-textured nickel were cleaned by ultrasonification for 30 minutes in isopropanol. The cleaned Ni substrates were annealed at 800–1000° C. for 1-2 hours in a high vacuum furnace to obtain the required cube texture. The coating of the nickel was accomplished using spin coating at 2000 RPM for 40 seconds or dip coating with a withdrawal velocity of 1–3 m/hour. With dip coating, the strip of nickel was typically 1 cm wide and 20 cm long.

The nickel substrates were placed in a quartz tube equipped with a gas inlet and outlet. A bottled gas mixture containing 4% hydrogen in 96% argon was allowed to flow for 20–30 minutes at room temperature. At the same time, a tube furnace was heated to the desired temperature of 600–1200° C. The $La_2Zr_2O_7$ film started to crystallize as a c-axis aligned film at temperatures as low as 800° C. The quartz tube containing the coated substrate was then introduced into the furnace and heated for periods varying from 5 minutes to 1 hour.

After heat treatment, the coated substrate was quenched to room temperature by removing the quartz tube out of the furnace. During this time, a gas mixture of 4% hydrogen and 96% argon was continually flowing through the quartz tube.

Highly crystalline lanthanum zirconium oxide ($La_2Zr_2O_7$) film on (100)[001] roll-textured Ni substrates was obtained. The texture of films were analyzed by X-ray diffraction (XRD), and film microstructure was analyzed using scanning electron microscope (SEM), and electron back scatter Kikuchi patterns (EBKP).

Figure 2C:
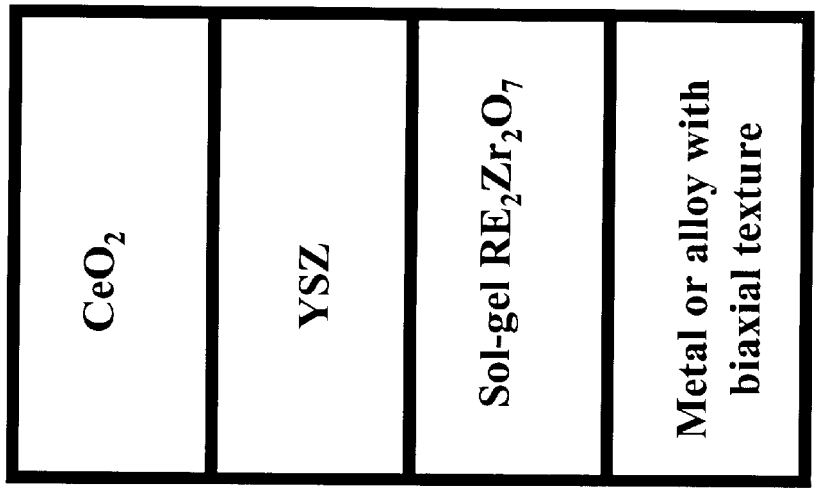
FIG. 2c is a schematic of a buffer layer architecture having the layers: $CeO_2$, YSZ, $RE_2Zr_2O_7$, and a biaxially textured substrate.
Figure 2B:
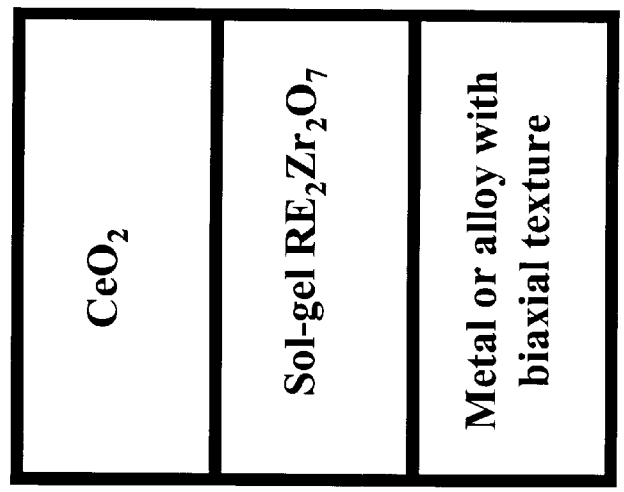
FIG. 2b is a schematic of a buffer layer architecture having the layers: $CeO_2$, $RE_2Zr_2O_7$, and a biaxially textured substrate.
Figure 2A:
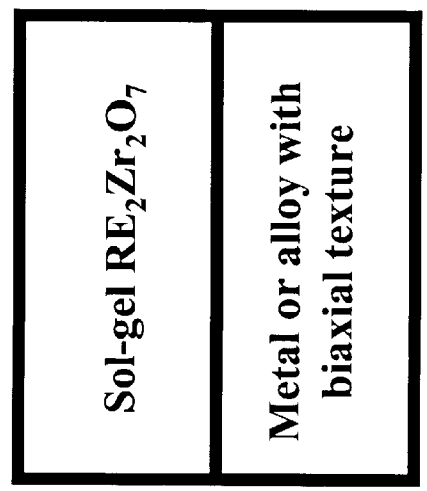
FIG. 2a is a schematic of a buffer layer architecture having the layers: $RE_2Zr_2O_7$ and a biaxially textured substrate.
Figure 3:
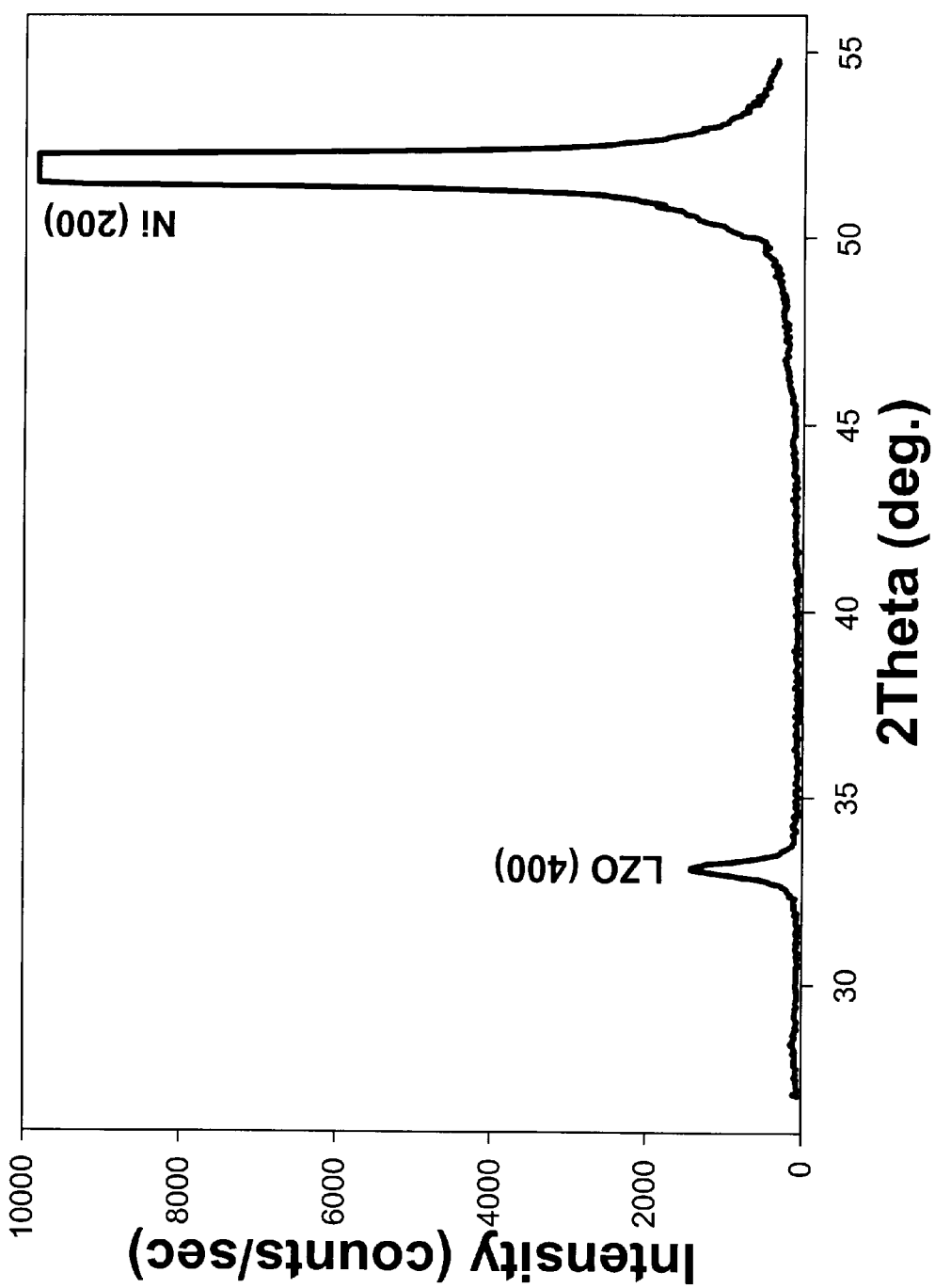
FIG. 3 is a theta-2-theta scan of c-axis oriented $La_2Zr_2O_7$ film on a textured Ni substrate.
Figure 4:
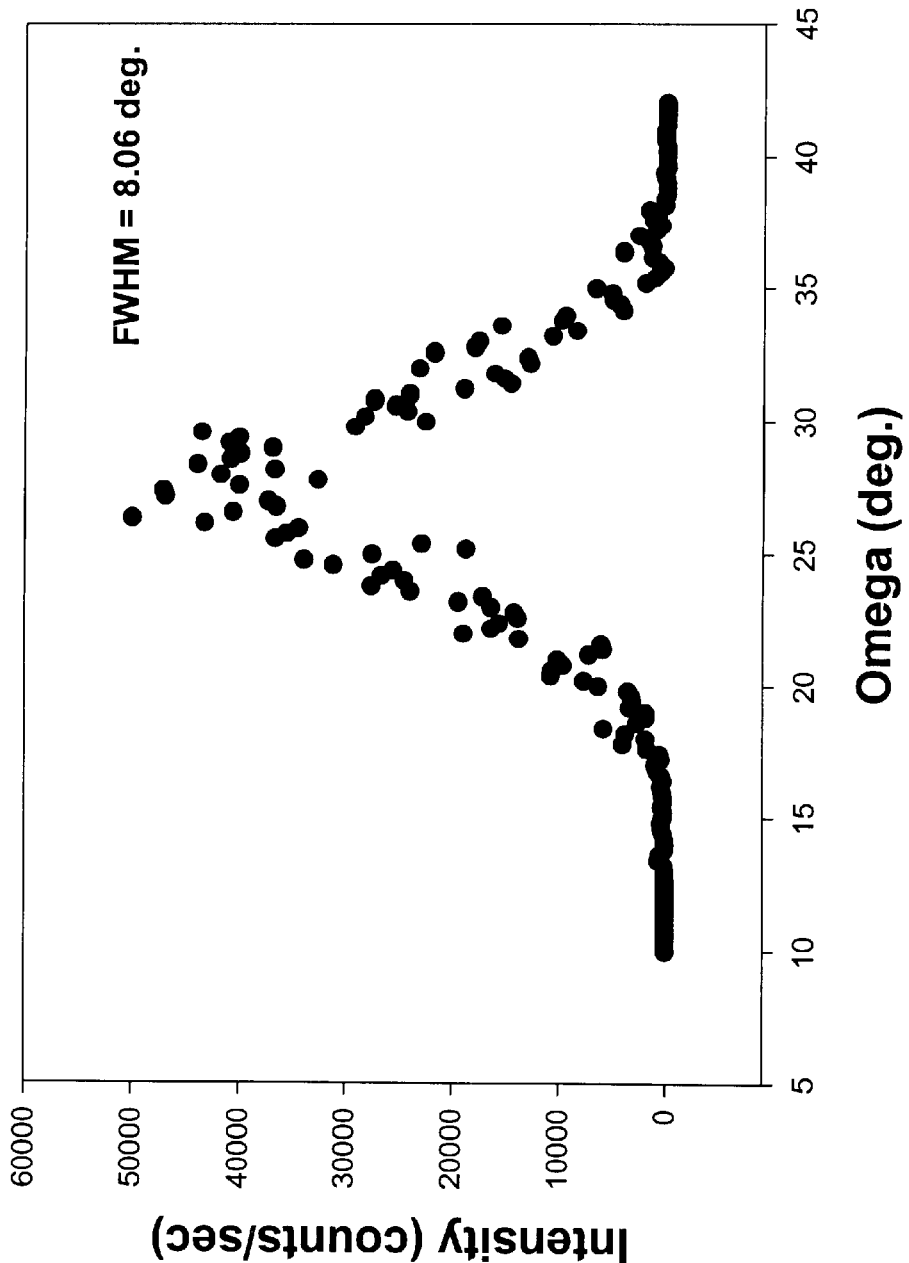
FIG. 4 is an omega scan of the Ni (002) reflection (Phi=0)(FWHM=8.06°) of a 500 Å thick $La_2Zr_2O_7$ film on a textured Ni substrate.
Figure 5:
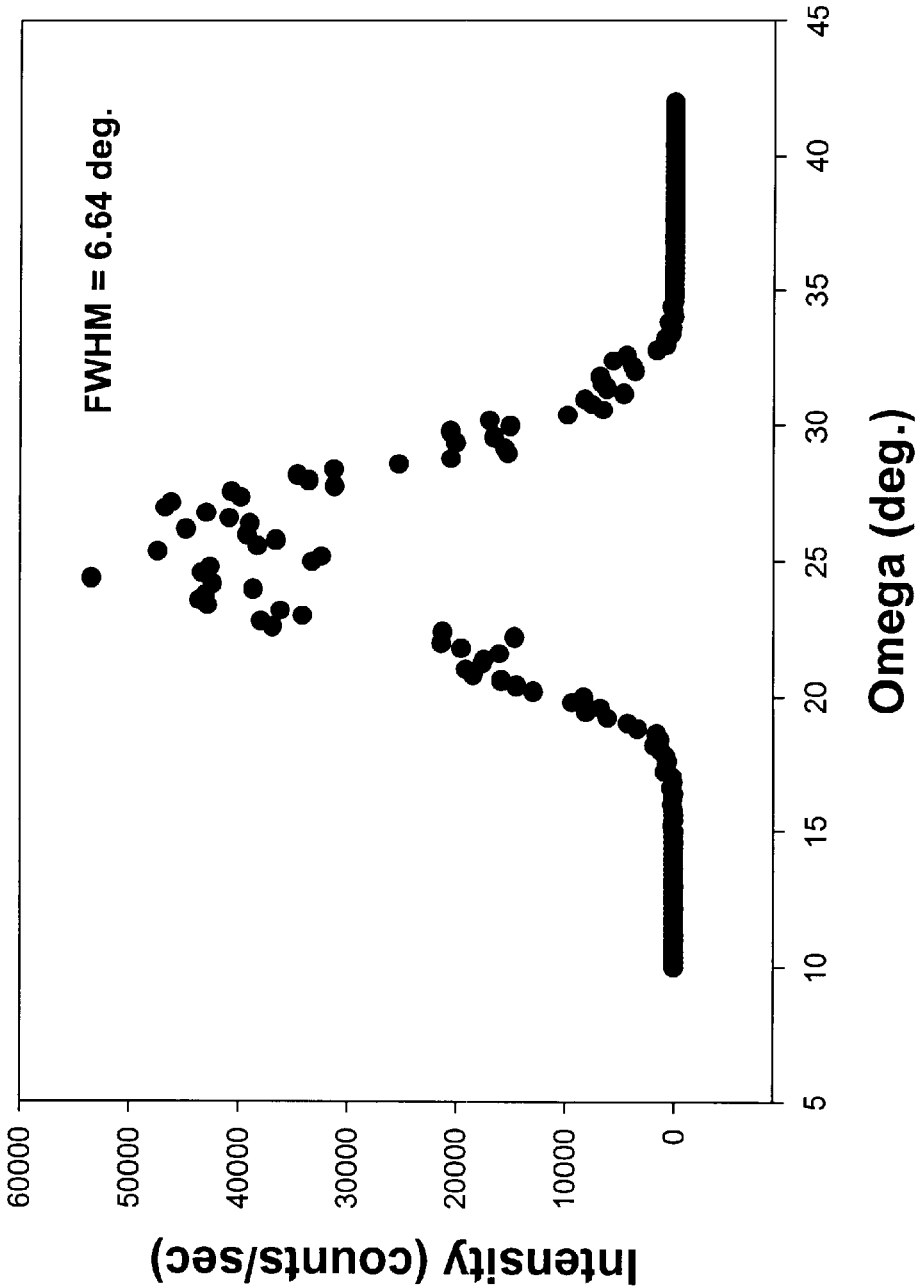
FIG. 5 is an omega scan of the Ni (002) reflection (Phi=90)(FWHM=6.64°) of a 500 Å thick $La_2Zr_2O_7$ film on a textured Ni substrate.
Figure 6:
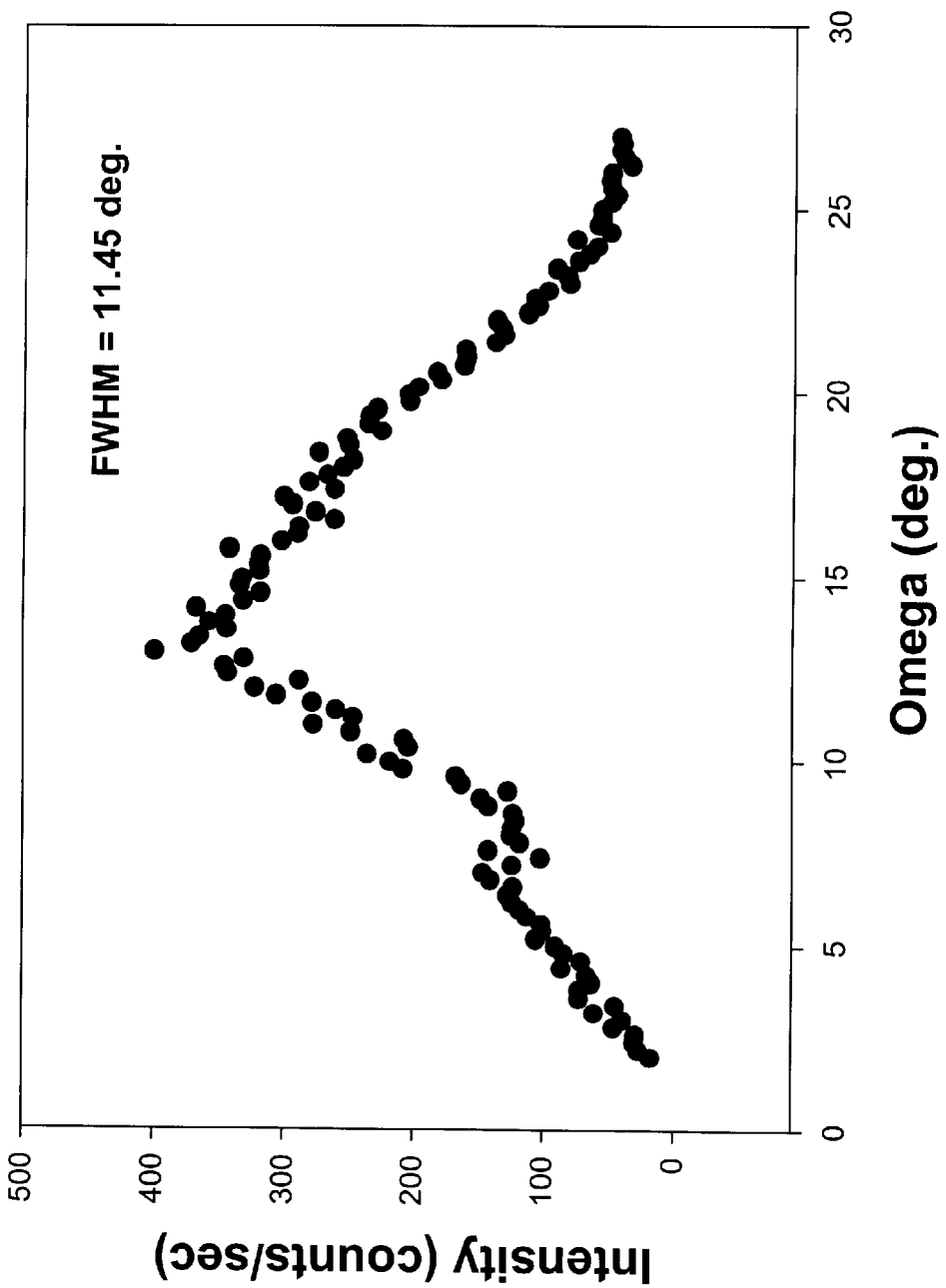
FIG. 6 is an omega scan of the $La_2Zr_2O_7$ (004) reflection (FWHM=11.45°) of a 500 Å thick $La_2Zr_2O_7$ film on a textured Ni substrate.
Figure 7:
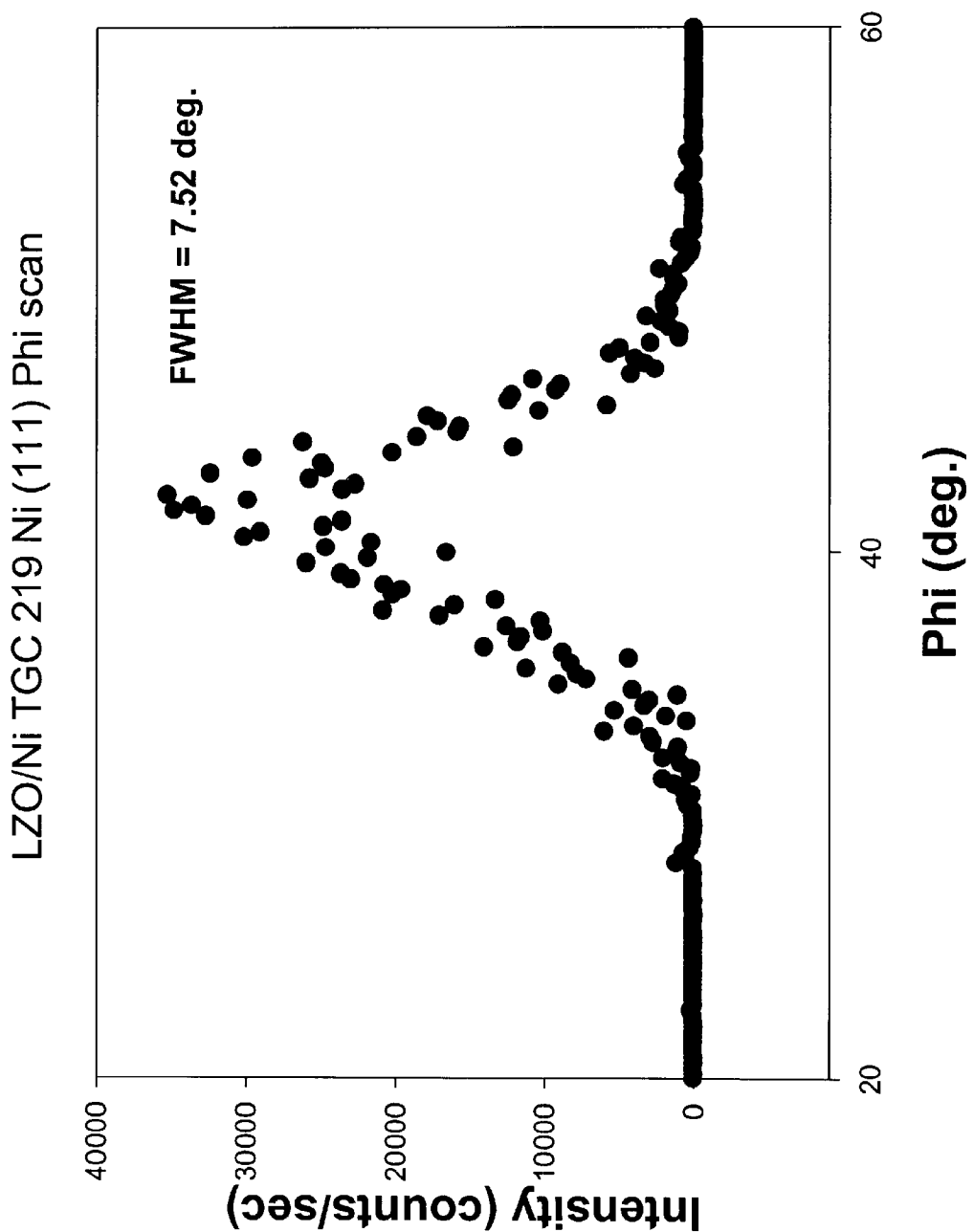
FIG. 7 is an phi scan of the Ni (111) reflection (FWHM=7.52°) of a 500 Å thick $La_2Zr_2O_7$ film on a textured Ni substrate.
Figure 8:
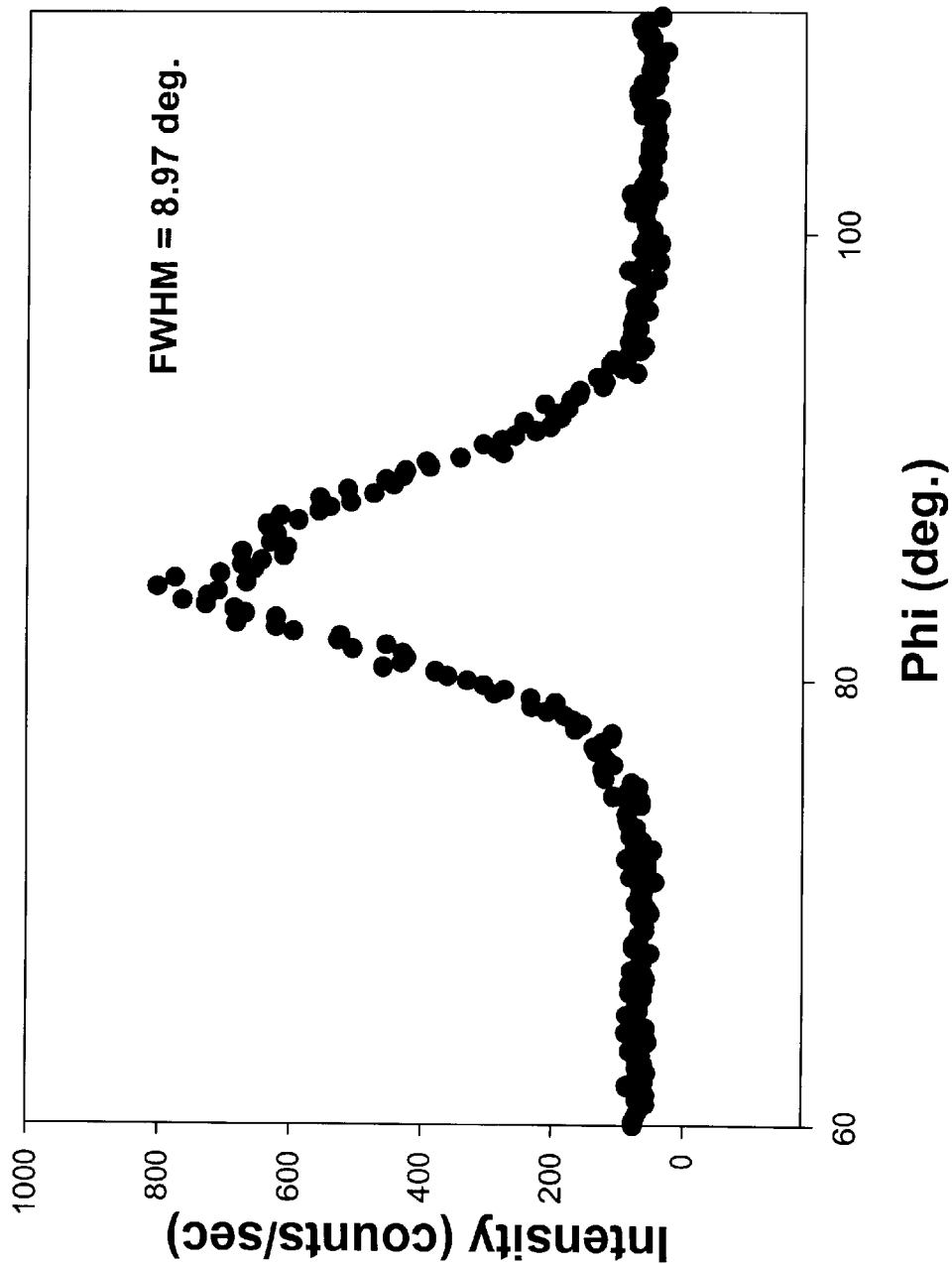
FIG. 8 is a phi scan of the $La_2Zr_2O_7$ (222) reflection (FWHM=8.97°) of a 500 Å thick $La_2Zr_2O_7$ film on textured Ni substrate.
Figure 9:
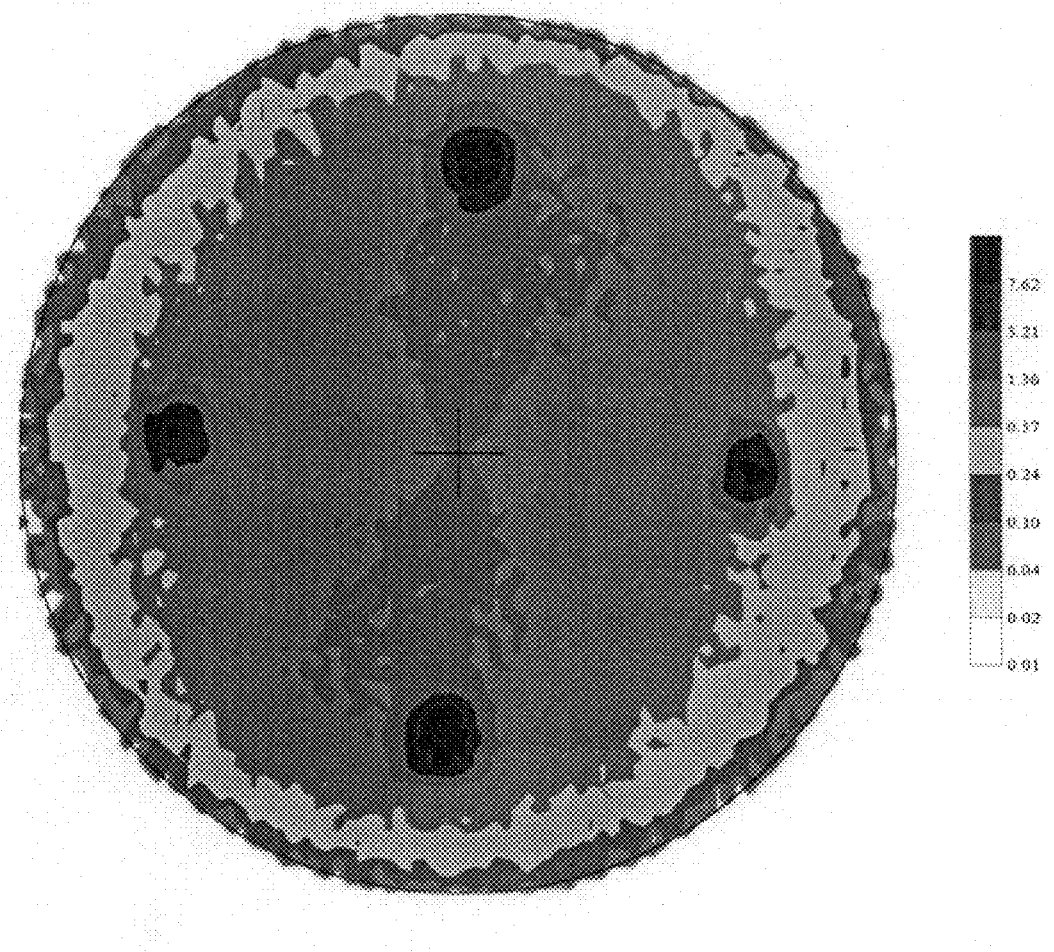
FIG. 9 is the $La_2Zr_2O_7$ (222) pole figure of a 500 Å thick $La_2Zr_2O_7$ film on a textured substrate.

As illustrated in FIGS. 2a, 2b, and 2c, a sol-gel grown $RE_2Zr_2O_7$ (rare earth zirconium oxide) buffer layer can be used as a template to grow any electronic material, including high temperature superconductors. The $RE_2Zr_2O_7$ can also be used with (FIG. 2c) or without (FIGS. 2a, 2b) a YSZ layer. Also, $CeO_2$ cap layers can be added (FIGS. 2b, 2c). A roll-textured metal substrate is preferably used as a template; however, any biaxially textured substrate is acceptable for use with this invention.

FIGS. 3–9 illustrate the XRD data for a 500 Å thick sol-gel grown $La_2Zr_2O_7$ film that was heat-treated at 1160° C. in a flowing gas mixture of 4% $H_2$ and 96% Ar on roll-textured Ni substrate. The strong (400) peak of $La_2Zr_2O_7$ in FIG. 3 indicates the presence of a strong c-axis aligned film. The omega and phi scans of FIGS. 4–8 and $La_2Zr_2O_7$ (222) pole figures of FIG. 9 indicate the presence of a single in-plane textured $La_2Zr_2O_7$ film. Also, the pole figures of FIG. 9 indicate the presence of single cube orientation. A SEM micrograph indicated the presence of a dense and crack-free microstructure.

EXAMPLE 2

Yttria stabilized zirconia (YSZ) films were grown on sol-gel deposited $La_2Zr_2O_7$/Ni substrate. The $La_2Zr_2O_7$ layer was formed using the method according to the invention. The YSZ film was grown by rf magnetron sputtering.

The sol-gel $La_2Zr_2O_7$/buffered Ni substrates were mounted on a heating block inside the sputter system. Prior to heating the substrate, the sputter chamber was evacuated to a pressure of about $1 \times 10^{-6}$ Torr. The chamber was then back-filled to a pressure of 10 mTorr with a mixture of 40% $H_2$ and 96% Ar. The substrate was heated to about 780° C. and annealed at 780° C. for 10 minutes prior to sputtering. After annealing, YSZ was sputter deposited at 780° C. for about 1–2 hours with an on-axis YSZ target located about 5 cm from the substrate. The plasma power was 75 W at 13.56 MHz.

The resulting YSZ film was smooth, epitaxial and dense. The thickness of the YSZ film was estimated to be approximately 2000–3000 Å. A thin (about 150 Å) layer of cerium oxide ($CeO_2$) film was grown on the YSZ/$La_2Zr_2O_7$/Ni substrate by rf magnetron sputtering. The conditions used were similar to the deposition of the YSZ except for a shorter sputtering time and use of a $CeO_2$ target. The resulting $CeO_2$ cap layer was also epitaxial.

EXAMPLE 3

A precursor YBCO film was grown on $CeO_2$/YSZ/ $La_2Zr_2O_7$/Ni substrate. The $La_2Zr_2O_7$ layer was formed using the method according to the invention, and the $CeO_2$ and YSZ layers were formed using sputtering. The YBCO film was grown by electron beam co-evaporation of Y, $BaF_2$, and Cu.

The combined deposition rate of the YBCO film was approximately 0.5 nm/sec. During evaporation, the buffer layers were held at approximately 100° C. while the initial pressure of $2 \times 10^{-6}$ Torr rose to $6 \times 10^{-6}$ Torr. Tantalum cruciles were used for the Cu, Y, and $BaF_2$ sources. Steady $BaF_2$ evaporation rates were obtained by covering the crucile with a matching lid with a 3-mm orifice. The deposited precursor films were post-annealed in a flowing mixture of $N_2$, $O_2$, and $H_2O$ with the partial pressure of $O_2$ at about 200 mTorr and the partial pressure of $H_2O$ at about 40 Torr. The post-annealing was at 740° C. for about 60 min. At the end of the post-annealing the gas flow was switched to the dry conditions by reducing the partial pressure of water.

The sample was then cooled to 500° C. for a 30 minute oxidation anneal in one atmosphere of $O_2$. The high-temperature anneal under wet conditions resulted in conversion of the Y, $BaF_2$, Cu into $Yba_2Cu_3O_7-x$.

Figure 10:
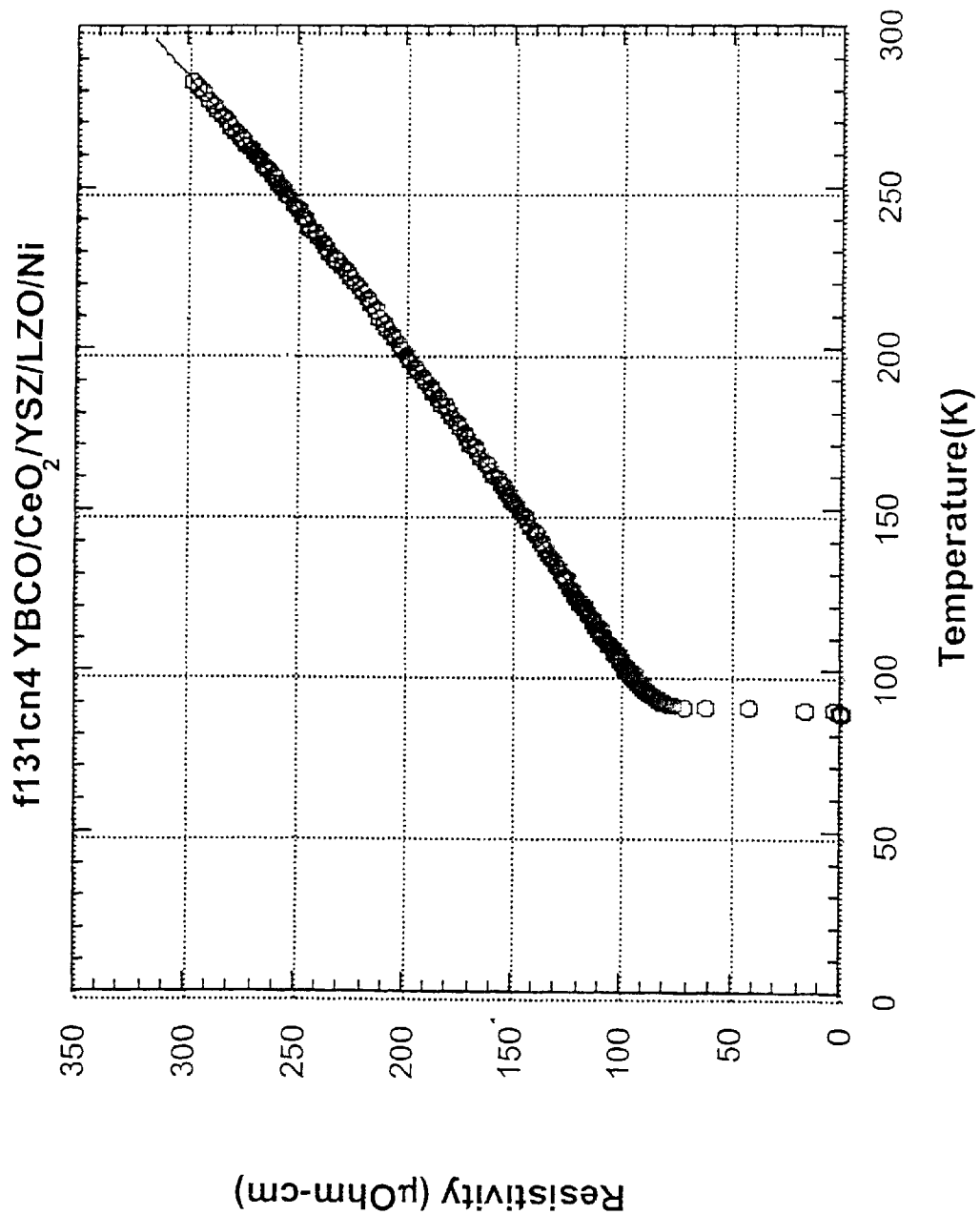
FIG. 10 is the resistivity plot for a 3000 Å thick YBCO film grown by a $BaF_2$ process on $CeO_2$ (150 Å)/YSZ (2000 Å)/$La_2Zr_2O_7$ (500 Å)/Ni substrate.
Figure 11:
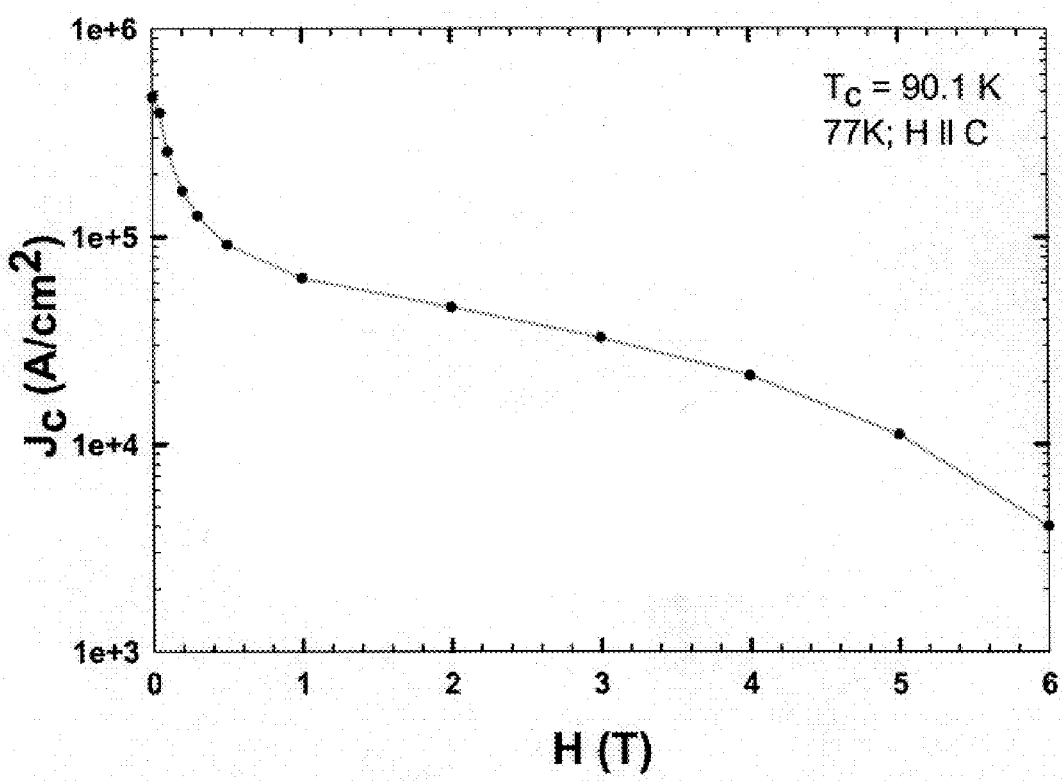
FIG. 11 is the field dependence of $J_C$ for a 3000 Å thick YBCO film grown by a $BaF_2$ process on $CeO_2$ (150 Å)/YSZ (2000 Å)/$La_2Zr_2O_7$ (500 Å)/Ni substrate at 77 K.

The temperature dependence of the resistivity for an approximately 3000 Å thick YBCO film on $CeO_2/La_2Zr_2O_7/Ni$ substrates is shown in FIG. 10. The transition temperature ($T_C$) obtained was approximately 90 K. FIG. 11 shows the field dependence of $J_C$ for a 3000 Å thick YBCO films on $CeO_2/La_2Zr_2O_7/Ni$ substrates. A high $J_C$ of 480,000 A/cm² at 77 K and zero field was obtained. As illustrated in FIGS. 10 and 11, the sol-gel deposited $La_2Zr_2O_7$ layer provides a good template.

What is claimed is:

1. A method of forming a buffer layer on a substrate, comprising the steps of
    coating a metal or metal alloy substrate with a coating solution;
    pyrolyzing the coating solution to form a biaxially textured $(RE_xA_{(1-x)})_2O_{2-(x/2)}$ buffer layer over the substrate, wherein $0<X\leq0.70$ and RE is selected from the group consisting of La, Nd, Sm, Eu, Gd, Tb, Dy, Ho, Er, Tm, Yb, and Lu, and wherein A is selected from the group consisting of $Zr^{+4}$, $Ce^{+4}$, and $Hf^{+4}$.

2. The method according to claim 1, further comprising the step of cold rolling the metal or metal alloy substrate to form a biaxially textured substrate, said cold rolling step before said coating step.

3. The method according to claim 1, further comprising the step of sonification of the metal or metal alloy substrate before said coating step.

4. The method according to claim 1, wherein the coating solution is a rare earth methoxyethoxide in 2-methoxyethanol.

5. The method according to claim 4, wherein the rare earth is selected from the group consisting of Nd, Sm, Eu, Gd, Tb, Dy, Ho, Er, Tm, Yb, and Lu.

6. The method according to claim 1, wherein said pyrolyzing step includes heating the coating solution to between about 600–1455 ° C.

7. The method according to claim 1, wherein x=0.5.

8. The method according to claim 1, wherein the metal or metal alloy substrate is biaxially textured.

9. The method according to claim 8, wherein the metal or metal alloy substrate is selected from the group consisting of nickel, copper, iron, aluminum, and alloys containing any of the foregoing.

10. The method according to claim 1, wherein said pyrolyzing step is in a reducing atmosphere.

11. The method according to claim 10, wherein said pyrolyzing step further includes introducing at least one of water or oxygen gas into the atmosphere to reduce processing temperatures during said pyrolyzing step.

12. The method according to claim 11, wherein the $(RE_xA_{(1-x)})_2O_{2-(x/2)}$ buffer layer has a structure selected from the group consisting of fluorite and pyrochlore.

* * * * *